US009917218B2

(12) United States Patent
Kinge et al.

(10) Patent No.: US 9,917,218 B2
(45) Date of Patent: Mar. 13, 2018

(54) PROCESS FOR PREPARING QUANTUM DOT ARRAY AND QUANTUM DOT SUPERLATTICE

(71) Applicant: TOYOTA MOTOR EUROPE NV/SA, Brussels (BE)

(72) Inventors: Sachin Kinge, Brussels (BE); Enrique Canovas Diaz, Mainz (DE); Mischa Bonn, Frankfurt am Main (DE)

(73) Assignee: TOYOTA MOTOR EUROPE, Brussels (BE)

( * ) Notice: Subject to any disclaimer, the term of this patent is extended or adjusted under 35 U.S.C. 154(b) by 0 days.

(21) Appl. No.: 15/114,267

(22) PCT Filed: Feb. 6, 2014

(86) PCT No.: PCT/EP2014/052362
§ 371 (c)(1),
(2) Date: Jul. 26, 2016

(87) PCT Pub. No.: WO2015/117659
PCT Pub. Date: Aug. 13, 2015

(65) Prior Publication Data
US 2017/0162733 A1 Jun. 8, 2017

(51) Int. Cl.
*H01L 31/0352* (2006.01)
*H01L 31/18* (2006.01)

(52) U.S. Cl.
CPC ........... *H01L 31/035218* (2013.01); *H01L 31/035236* (2013.01); *H01L 31/1836* (2013.01); *H01L 31/1868* (2013.01)

(58) Field of Classification Search
CPC ..... H01L 31/035218; H01L 31/035236; H01L 31/1868
See application file for complete search history.

(56) References Cited

U.S. PATENT DOCUMENTS

| 2011/0241042 A1* | 10/2011 | Chen ........................ H01L 33/08 257/94 |
| 2012/0202356 A1* | 8/2012 | Huang .............. H01L 21/02186 438/785 |
| 2012/0312375 A1* | 12/2012 | Seok, II .............. H01L 51/4226 136/263 |

FOREIGN PATENT DOCUMENTS

| CN | 101312218 A | 11/2008 |
| CN | 102251235 A | 11/2011 |
| JP | 2011205038 A | 10/2011 |

OTHER PUBLICATIONS

Gonzalez-Pedro et al., "Modeling High-efficiency Quantum Dot Sensitized Solar cells", Sep. 15, 2010, ACS Nano, vol. 4, No. 10, p. 5783-5790.*
Oct. 29, 2014 International Search Report issued in International Patent Application No. PCT/EP2014/052362.
(Continued)

Primary Examiner — Michael Carter
(74) Attorney, Agent, or Firm — Oliff PLC

(57) ABSTRACT

The present invention presents a process for preparing a quantum dot array comprising at least the steps of: (a) providing a crystalline semiconductor substrate surface; (b) depositing quantum dots on the said substrate surface by a process of successive ionic layer adsorption and reaction (SILAR). The steps can be repeated to build up a quantum dot superlattice structure.

19 Claims, 4 Drawing Sheets

(56) References Cited

OTHER PUBLICATIONS

Aug. 9, 2016 International Preliminary Report on Patentability issued in International Patent Application No. PCT/EP2014/052362.
Sojiro Hachiya et al. "Effect of ZnS Coatings on the Enhancement of the Photovoltaic Properties of PbS Quantum Dot-Sensitized Solar Cells", Journal of Applied Physics, American Institute of Physics, US, vol. 111, No. 10, May 15, 2012, pp. 104315-1 through 104315-4.
Witoon Yindeesuk et al. "Optical Absorption of CdSe Quantum Dots on Electrodes With Different Morphology", AIP Advances, vol. 3, No. 10, Oct. 10, 2013, pp. 102115-1 through 102115-9.
Yaohong Zhang et al. "The Optical and Electrochemical Properties of CdS/CdSe Co-Sensitized TiO2 Solar Cells Prepared by Successive Ionic Layer Adsorption and Reaction Processes", Solar Energy, Pergamon Press, Oxford, GB, vol. 86, No. 3, Jan. 30, 2012, pp. 964-971.
H.M. Pathan et al. "Deposition of Metal Chalcogenide Thin Films by Successive Ionic Layer Adsorption and Reaction (Silar) Method", Bull. Mater. Science, vol. 27, No. 2, Apr. 2004, pp. 85-111.
Sojiro Hachiya et al., "Effect of ZnS coatings on the enhancement of the photovoltaic properties of PbS quantum dot-sensitized solar cells," Journal of Applied Physics, vol. 111, issue 10, pp. 104315-1 to 104315-4, (2012).
Nov. 7, 2017 Office Action issued in Japanese Application No. 2016-550613.

* cited by examiner

PROCESS FOR PREPARING QUANTUM DOT ARRAY AND QUANTUM DOT SUPERLATTICE

FIELD OF THE INVENTION

The present invention seeks to provide a new way of preparing quantum dot arrays, which may in preferred embodiments be stacked quantum dot superlattices, and can be used in optoelectronic devices such as solar cells.

TECHNOLOGICAL BACKGROUND TO THE INVENTION

By the term "quantum dots", reference is made here to nanometer sized particles of semiconductor material where quantum confinement is present. Depending upon the semiconductor material, the maximum sizes change but are usually below 100 nm. The exact size of the quantum dots may enable the semiconductor band gap to be modulated, which provides potential for increasing photo-electric conversion efficiency with respect to bulk films of semiconductor material in more conventional solar cells and related devices.

A three-dimensional ordered matrix of quantum dots (QDs), known as a QD solid (QDS) or a QD superlattice (QD-SL) has a potential in optoelectronic applications, including devices such as solar cells, LEDs, thermoelectric devices, etc. This type of structure is part of the "tandem" approach for developing new, third generation optoelectronic devices such as solar cells.

Hitherto QD-SLs have mostly been grown by epitaxial deposition techniques such as molecular beam epitaxy (MBE) or metal-organic chemical vapour deposition (MOCVD), these being techniques that require low vacuum, high temperature and pristine precursors. Solid state grown QD-SLs show a low defect density with QDs which are perfectly passivated by a bulk barrier material. On the other hand, their processing is characterized by high costs. Furthermore, only a few combinations of barrier material/QD pairs are able to be grown due to lattice matching constraints.

Alternatively, room temperature processing of colloidal QDs has been used for applying QDs to substrate surfaces. Colloidal QDs are most commonly spherical, but rod shapes and others are available. In this much cheaper approach, QD synthesis does not take place in situ (on top of a bulk substrate) but in solution. After QD synthesis, the QDs are applied to the substrate surface by spin coating or dropcasting protocols of molecularly passivated QDs onto a substrate. Due to the poorer surface passivation of the nanocrystals, the colloidal approach suffers from high defect concentration and is prone to photodegradation (through oxidation processes).

Meanwhile the technique of successive ion layer adsorption reaction (SILAR) is known for the preparation of thin films, as is disclosed in example in CN102251235 or CN101312218. In this technique, a substrate is alternatively soaked in a cation precursor solution and then an anion precursor solution. The cations may here for example the chosen among Cu, Zn, Sn and In, and the deposited anions are most commonly chalcogenides (sulfides and selenides in particular—tellurides are also possible candidates though not often used). More generally, thin films of CdS, CdSe, CdO, PbSe, PbS, SnS, ZnS, ZnO, and $Fe_2O_3$ have been reported as being prepared by SILAR techniques on a variety of substrates.

SUMMARY OF THE INVENTION

It is an aim of the present invention to provide a new way of preparing quantum dot arrays, which may in preferred embodiments be stacked quantum dot superlattices, and can be used in optoelectronic devices such as solar cells. It is desired to overcome the disadvantages of molecular beam epitaxy (MBE) and related methods which are very demanding in terms of cost, as well as being limited in terms of possible types and minimum purities of precursor materials. The present invention provides a wet room temperature growth process for QDs on a crystalline substrate by a SILAR (successive ionic layer deposition and reaction) method, and also provides inorganic passivation of QDs through the growth of a thin film on top of the dots (barrier material matching or not the one employed for the substrate). The process can be repeated in order to achieve QD layer stacks acting as QD-SLs. Control on QD size in the superlattice can be advantageously achieved by controlling the growth deposition rate (e.g. by controlling soaking time and/or precursor concentrations) of QDs and barrier material spacer. Multiple QD stacks can be prepared with a view to allowing the active material to have strong absorption-emission properties, favourable for optoelectronic applications.

Thus, in one aspect, the present invention is directed to a process for preparing a quantum dot array comprising at least the steps of:

(a) providing a crystalline semiconductor substrate surface;

(b) depositing quantum dots on the said substrate surface by a process of successive ionic layer adsorption and reaction (SILAR).

In preferred process embodiments, in a further step (c), the quantum dots are passivated by the addition of an inorganic shell or film, most preferably of the same nature as the (crystalline semiconductor) substrate surface used in step (a) of the method of claim 1. In a further preferred step, there may be a repetition of the quantum dot deposition process according to step (b) set out above, applying quantum dots to the inorganic passivation layer, which is preferably of the same nature as the (crystalline semiconductor) substrate surface used in step (a) of the method set out above. Multilayer structures may be obtained via multiple repetitions of the deposition process involving (substrate (=inorganic passivation layer)–QD) repeating cycles.

In another aspect, the present invention relates to a quantum dot array or a quantum dot superlattice structure obtained by the above-mentioned processes.

DETAILED DESCRIPTION OF THE INVENTION

Figure 1:
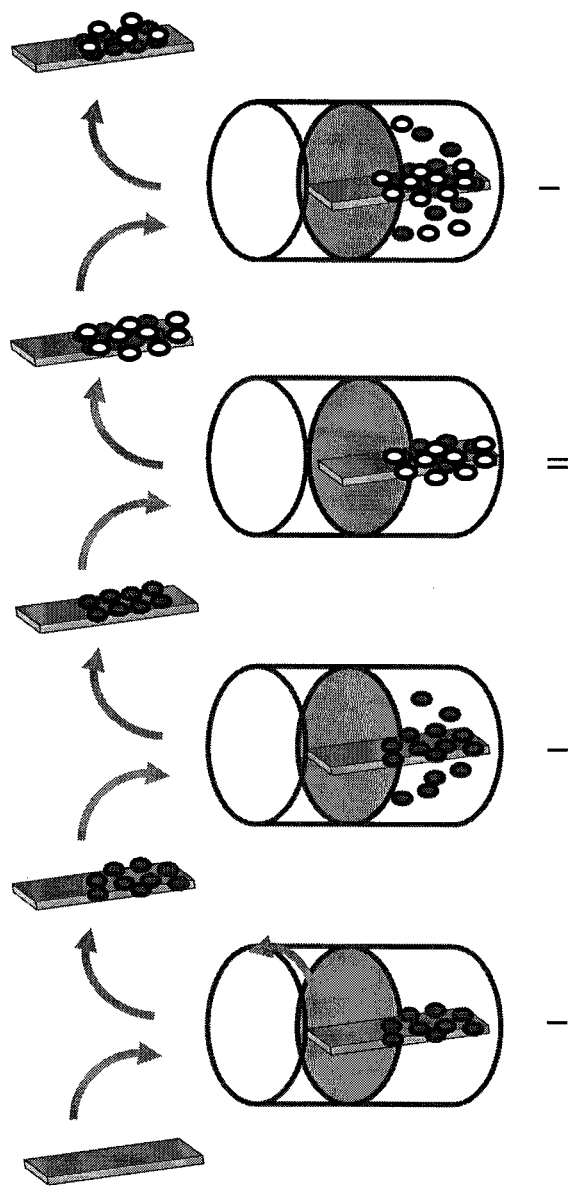
FIG. 1 is a schematic diagram showing the growth of an AB compound by a SILAR method.

The Successive Ionic Layer Adsorption and Reaction (SILAR) method is based on triggering successive reactions in solutions such as aqueous (or ethanolic or any other suitable solutions of) saturated ionic solutions with a solid interface, as is illustrated by the dipping of a planar substrate in FIG. 1. Cation and anion dissolved precursors in the solutions will react with the substrate to yield the desired product. FIG. 1 is a schematic diagram showing the growth of an AB compound by a SILAR method. One SILAR cycle refers to (a) $A^+$ ion solution dipping; (b) rinsing-removal of $A^+$ ions in excess; (c) $B^-$ ion solution dipping; (d) rinsing-removal of $B^-$ ions in excess.

The nucleation of a QD layer by SILAR follows a protocol analogous to that used for the growth of a thin film (differing only in the amount of material deposited). Control of deposition on the substrate surface to achieve only very small particles (quantum dots) can be achieved by controlling deposition rate (as is done in MBE and MOCVD). Control of dipping time and/or precursor concentrations provide means for controlling material deposition. With a relatively slow rate and with adequate lattice mismatch between the substrate and deposited layer, only dots will nucleate. A SILAR process for deposition onto an amorphous substrate (e.g. glass) will produce a polycrystalline layer, not QDs or single crystal.

As an illustrative example, in the deposition of lead sulphide (PbS) quantum dots (QDs), one SILAR cycle is as follows:

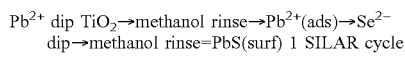

$Pb^{2+}$ dip $TiO_2 \rightarrow$ methanol rinse $\rightarrow Pb^{2+}$(ads) $\rightarrow Se^{2-}$ dip $\rightarrow$ methanol rinse=PbS(surf) 1 SILAR cycle Lead sulphide (PbS) is a preferred quantum dot material in the present invention.

In an appropriate embodiment, given here as an example process that may be used in the invention, the following process may be used for SILAR growth of QD:
Exemplary Protocol The chemicals listed below were used as received without further purification.

Chromatography grade methanol, 99% Pb nitrate (Pb$(NO_3)_2$ and ($Na_2S$) 98% were obtained. First the dissolved oxygen was removed from the methanol. The precursors were dissolved in methanol freed from oxygen. Before the SILAR cycle the substrates were immersed in methanol for 30 seconds. During the first dip 20 sec, $Pb^{2+}$ is absorbed to the substrate surface from 0.02 mol/L methanolic Pb$(NO_3)_2$ solution. This is followed by rinsing with methanol for 30 sec. The ions will locate preferentially at specific sites defined by low surface binding energy, making covalent bonds with substrate dangling bonds. Any unbound ions are rinsed away, and during the second dip in sodium sulphide solution in methanol 0.02 mol/L, $S^{2-}$ will react with the $Pb^{2+}$ ions facilitating formation of small particles of PbSe (nanocrystals or QDs).

As actual cation precursor solutions for $Pb^{2+}$ deposition, commonly the salt of an organic acid such as an acetate or other carbon/late salt of $Pb^{2+}$ may be used. Solutions typically used to provide sulfide ions include sodium or potassium sulphide ($S^{2-}$) solutions. Thioacetamide $CH_3CSNH_2$ can also be used as a sulphur precursor. Any anionic source which is homogeneously dispersible in solvents like methanol may also suitable. Reference can be made to known materials and methods in the art e.g. as given in Pathan, Lokhande, Science, 2004, 27, 85-111.

Apart from cadmium selenide (CdSe), other materials deposited using a SILAR method as quantum dots in the present invention may appropriately include chalcogenide materials of groups I-VI, II-VI, III-VI, V-VI, VIII-VI binary and I-III-VI, II-II-VI, II-III-VI, II-VI-VI and II-V-VI ternary chalcogenides and composites e.g. AgS, $Sb_2S_3$, $Bi_3Se_2$, CoS and CdS, PbSe, PbS, ZnS, ZnSe etc. Tellurides may also be used.

In principle, any semiconducting (crystalline) material can serve as substrate (and barrier material) in the present invention. In one preferred embodiment, materials grown by SILAR could also be used as substrate. Preferred materials grown by SILAR would then include the same ones as those indicated in the above list of preferred materials deposited using a SILAR method as quantum dots in the present invention. In effect, it would be of interest to grow the whole QD solid at room temperature (QD and barrier material). Whether or not it is possible to grow QDs onto such a substrate will depend on lattice match constraints.

In a typical room temperature SILAR method, the anion and cation precursor solutions contain anion/cation concentrations in the range of 0.001 M to 0.1 M, and the time of the exposure of the substrate to each solution is between 1 second and 1 minute, the rinsing steps also taking place over the same timeframe, with typical step times being 10 seconds or 20 seconds. Between 10 and 1000 SILAR cycles may appropriately be used.

All the SILAR process can be advantageously carried out at room temperature and no external energy is needed for the growth. By repeating the process, carrying out different cycles, a degree of control over the QD size can be achieved. However the dots will be randomly distributed over the substrate surface and their size distribution will be broad. SILAR QDs will be influenced by several parameters during growth like the number of cycles, duration of dipping, post-annealing recipes, etc.

In the preparation of multi-layer structures according to the present invention, the first layer will typically be characterized by a random distribution of dots over unit area and (depending on growth conditions) some degree of heterogeneity as regards sizes—this is difficult to avoid in practice. However, for the second layer in the stack (cf. FIG. 2) it is possible to achieve improved homogeneity of QD size by tuning of barrier thickness (only the bigger buried dots will promote a new dot on top, and hence the QD size distribution becomes narrower). In a preferred 3D array, there will be vertical stacking of dots.

To avoid the problem of random distribution of QDs for the creation of an array, it is also possible to use templates as the starting substrates. These substrate surfaces are covered with surface structures, patterns created by photo/chemical etching or by soft lithographic techniques. This first template layer will create the ordered array of QDs. In successive layers there is no need for a template but particles will grow in patterns with similar mechanisms as mentioned above.

For optoelectronic applications, a certain thickness for the active material may in some cases be advantageous. In a preferred embodiment of the present invention, a method is provided for preparing a quantum dot superlattice (QD SL) with a narrow QD size distribution.

For the formation of a three-dimensional QD-SL, it is envisaged in the present invention to repeat the SILAR process described above as many times as desired to produce a number of stacked QD layers. A QD-barrier layer is appropriately grown on top of the underlying QD array. In order to increase control over the QD size distribution, it is preferable to control the barrier material thickness for the reasons that will be explained below.

In accordance with the route followed in conventional epitaxial methods for preparing stacked layer structures, QD distribution may be controlled based on QD strain-induced growth.

In preferred process embodiments of the present invention, inorganic passivation (of QDs) is used, a first layer with a distribution/array of dots being covered, most preferably, with an inorganic layer made of the same material as the substrate.

Figure 2:
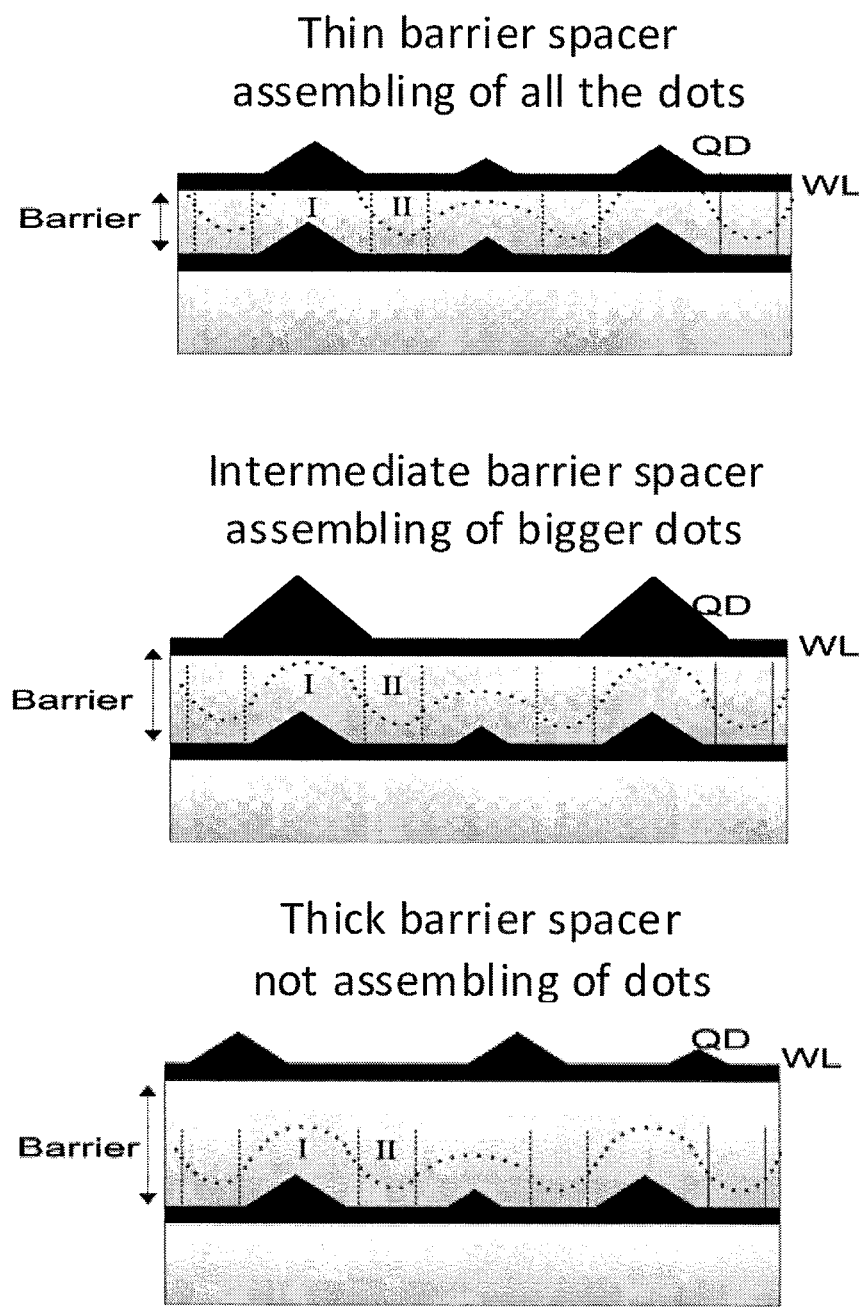
FIG. 2 schematically shows the strain induced nucleation of QDs in a bilayer stack as a function of barrier material thickness.
Figure 3:
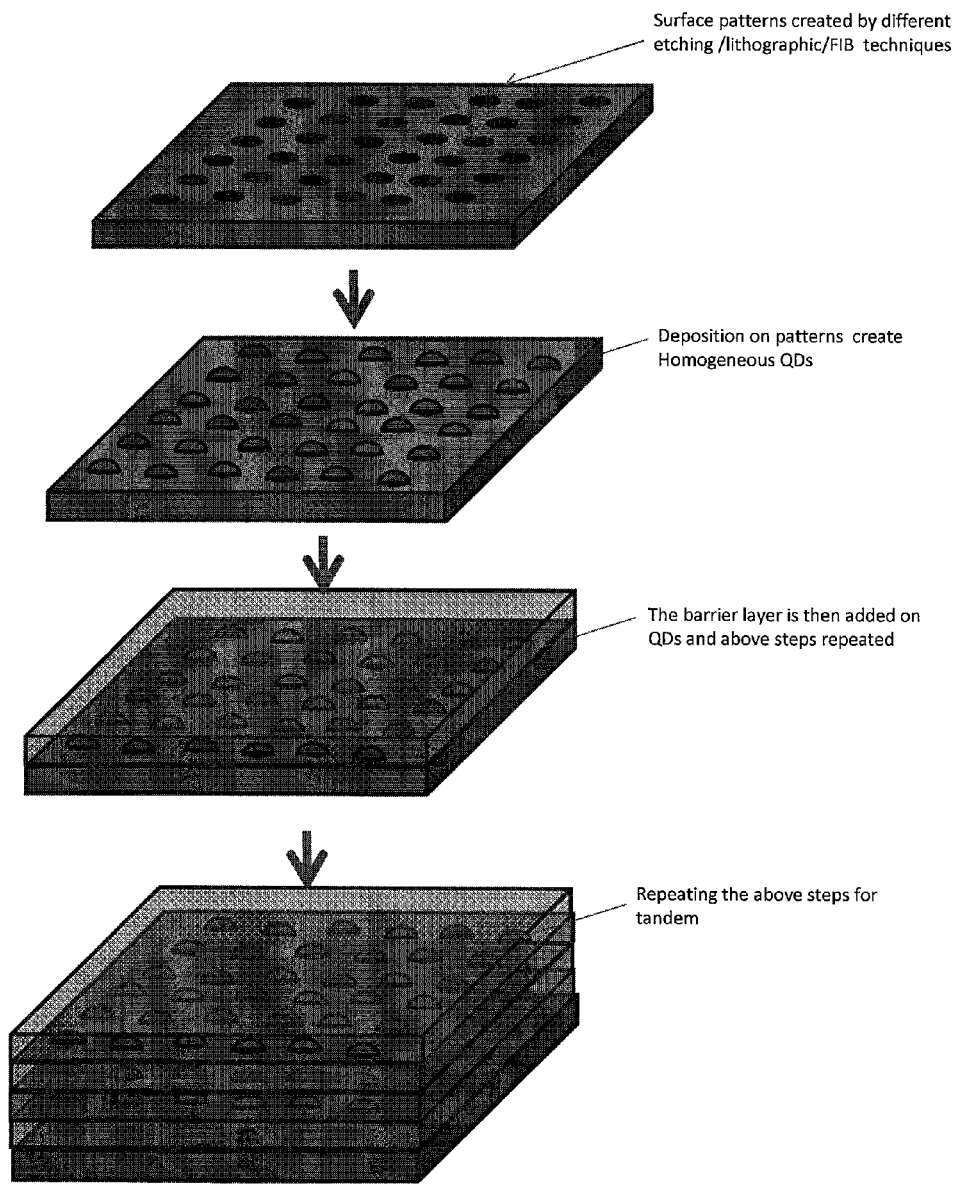
FIG. 3 schematically shows formation of tandem structures using SILAR growth on a patterned substrate.

FIG. 2 schematically shows the strain induced nucleation of QDs in a bilayer stack as a function of barrier material thickness. WL stands for "wetting layer". Depending on the mismatch between substrate an deposited material its is possible to have two different regimes for the nucleation of dots. One of them implies that before the dots are formed there is nucleation of a thin film (WL)—this is known in the art as a Stranski-Krastanow situation. The other option is that the dots nucleate directly (without the assistance of a WL)—this is called a Volmer—Webber situation.

As shown in the top part of FIG. 2, with a low barrier thickness, the strain pattern induced by QD of any size from the first layer will trigger the growth of QDs in the second layer (broad QD size distribution). As shown in the middle part of the Figure, with an intermediate barrier thickness, only the biggest dots from the first layer will trigger the nucleation of dots in the second layer on particular sites (narrow QD size distribution). As shown in the bottom part of the Figure, with a high layer thickness, the strain pattern of dots in the first layer will not affect the nucleation of dots in the second layer (broad QD size distribution).

Thus, for a particular range of barrier thickness (intermediate barrier thickness in FIG. 2) it is possible to achieve the vertical self-assembling of QDs as well as increased homogeneity on QD size for the second and successive layers. The vertical self-assembling will also serve to electronically couple QD layer stacks, which will be advantageous for the extraction (i.e. in solar cells) or injection (i.e. LEDs) of charges into the lattice.

In the present invention, in preparing three-dimensional stacks, the choice of potential candidate barrier layers (envisaged as being of the same nature as the substrate materials) is dependent upon lattice matching of QD/barrier. QD/barrier type II band alignments (where there is band offset in two materials—hence one charge carrier is localized in one material and the other is localized in the other material) are expected to be beneficial for PV applications where carriers need to be separated and type I (where both charge carriers are localized to the core) band alignment for emission applications (LED and QD lasers). Type I e.g. CdSe/ZnS, PbS/ZnS, PbS/CdS, type II: CdTe/CdSe, CdSe/CdTe and ZnTe/CdS, CdS/TiO$_2$, SnO$_2$, PbS/TiO$_2$, ZnO.QD/barrier systems.

Although there may be optimization of sizes for each possible type of material that could be used (e.g. QD size), layer widths of 10 to 100 nanometers are envisaged to be generally appropriate in order to promote ordering in the second layer of QDs. If the device needs only to have one QD layer in the stack, higher thickness may be appropriate.

Further, the barrier thickness should be such as to induce strain in the second deposition phase of SILAR of QD material. Exact preferable values of thickness will depend upon QD material type, and lattice properties. However, appropriately the thickness will be tuned until it induces strain suitable to grow QDs in the next SILAR cycle at preferred locations.

Within the practice of the present invention, it may be envisaged to combine any features or embodiments which have hereinabove been separately set out and indicated to be advantageous, preferable, appropriate or otherwise generally applicable in the practice of the invention. The present description should be considered to include all such combinations of features or embodiments described herein unless such combinations are said herein to be mutually exclusive or are clearly understood in context to be mutually exclusive.

EXPERIMENTAL SECTION—EXAMPLES

The following experimental section illustrates experimentally the practice of the present invention, but the scope of the invention is not to be considered to be limited to the specific examples that follow.

For SILAR lead sulfide quantum dot synthesis, chemicals were used as received without further purification. Chromatography grade methanol (CH$_3$OH) was obtained from VWR. Lead nitrate (Pb(NO$_3$)$_2$) 99% was obtained from Sigma-Aldrich. Sodium sulfide (Na$_2$S) 98% was also obtained from Sigma-Aldrich. First, dissolved gaseous oxygen was removed from a total of 300 mL methanol. Two 250 mL round bottom flasks were filled with 150 mL methanol chromatography grade each and a stream of argon was bubbled through them for one hour. For that, each flask was equipped with a rubber septum, a long needle piercing the rubber septum immersing its end into the solution. The long needle was connected with silicone tubings to the argon part of a Schlenk line. As an exhaust for the flushed argon, a shorter needle was used to pierce the septum, inserting it only enough to go through the septum, but not reaching the surface of the liquid. In a 100 mL screw cap bottle, 405 mg of lead nitrate was dissolved in 60 mL oxygen free methanol by 45 min sonication to give a clear solution. In a second 100 mL screw cap bottle 95 mg anhydrous sodium sulfide was dissolved in 60 mL methanol by 45 min sonication to give a white opaque solution. The remaining 180 mL of oxygen free methanol was divided into three 60 mL portions in 100 mL screw cap bottles labeled "methanol I", "methanol II" and "methanol III". All five bottles were transferred into a nitrogen atmosphere glove box. Under inert atmosphere the substrate was immersed into 60 mL methanol III for thirty seconds before the SILAR cycles were performed. One cycle consisted of 20 s immersion into 0.02 mol/L methanolic Pb(NO$_3$)$_2$ solution, 30 s immersion into methanol I rinsing bath, 20 s immersion into 0.02 mol/L methanolic Na$_2$S solution and 30 s immersion into methanol II rinsing bath. As the rinsing baths I and II might get polluted over the increasing number of SILAR cycles, a final 50 s immersion into 60 mL of methanol III was carried out after the completed SILAR process. A summary of the immersion times during a SILAR process is available in Table 1 below. The sample was allowed to dry in inert atmosphere. For batch processing multiple samples another 60 mL of oxygen-free methanol were used as wetting bath before the SILAR cycles instead of using the final rinsing bath methanol III.

TABLE 1

Immersion times for a SILAR process with n cycles

| Step | No. of immersions | Immersion time/s |
|---|---|---|
| Wetting | 1 | 30 |
| Pb$^{2+}$ | n | 20 |
| Rinse I | n | 30 |
| S$^{2-}$ | n | 20 |

TABLE 1-continued

Immersion times for a SILAR process with n cycles

| Step | No. of immersions | Immersion time/s |
|---|---|---|
| Rinse II | n | 20 |
| Rinse III | 1 | 50 |

Figure 4:
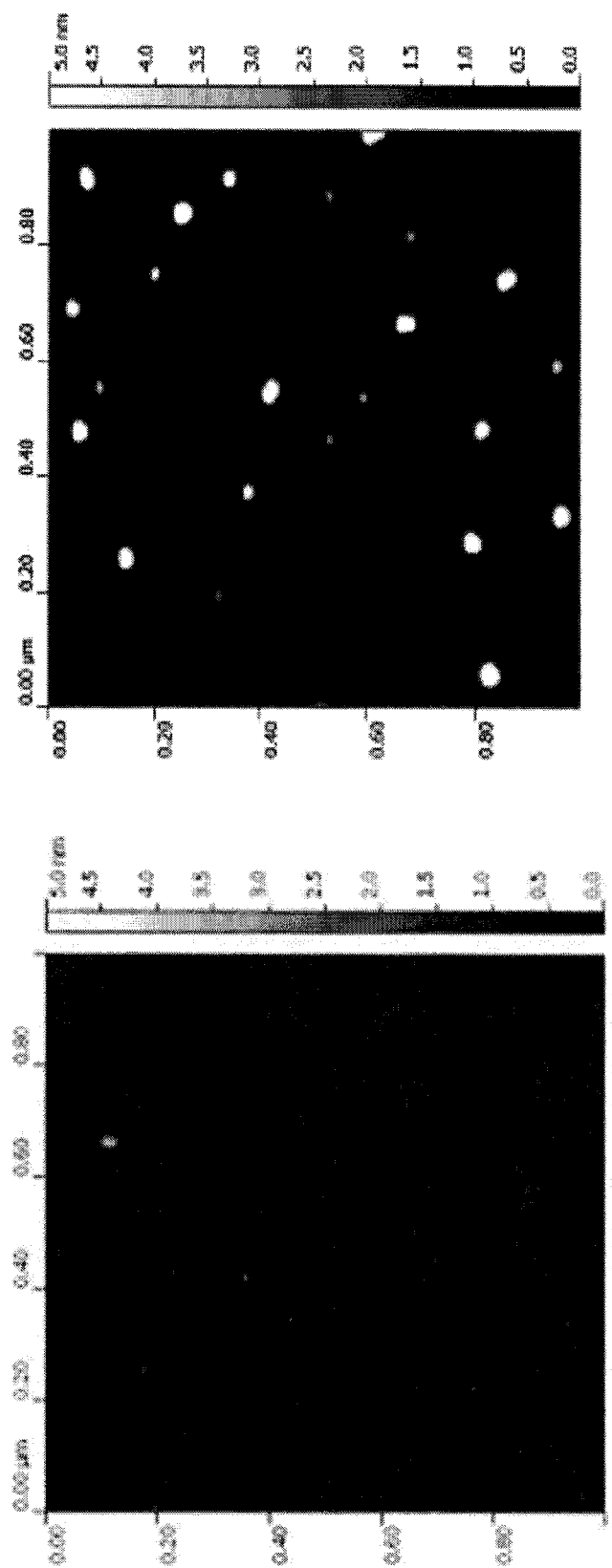
FIG. 4 shows atomic force microscopy (AFM) images of (top left) a $TiO_2$ bare substrate, (top right) PbS QDs nucleated on $TiO_2$ after 2 cycles.

As shown in FIG. 4:
(top left) AFM (atomic force microscopy) of a $TiO_2$ bare substrate;
(top right)—AFM of PbS QDs nucleated on $TiO_2$ after 2 cycles—height distribution peaking at ~2 nm. (bottom)

The invention claimed is:

1. Process for preparing a quantum dot array multilayer stack comprising at least the steps of:
   (a) providing a crystalline semiconductor substrate surface, wherein the crystalline semiconductor substrate surface is a patterned surface;
   (b) depositing quantum dots on the said substrate surface by a process of successive ionic layer adsorption and reaction (SILAR);
   (c) passivating the quantum dots by adding an inorganic shell or film to obtain an inorganic passivation layer that extends across a substantial part or all of the quantum dot array obtained in step (b); and
   (d) applying quantum dots on a surface of the inorganic passivation layer obtained in step (c) by a SILAR process.

2. Process according to claim 1, wherein the substrate surface is titanium dioxide ($TiO_2$).

3. Process according to claim 2, wherein the quantum dots deposited contain one or more materials selected from the group consisting of: lead sulfide (PbS), cadmium selenide (CdSe).

4. Process according to claim 3, wherein in step (c), the quantum dots are passivated by the addition of an inorganic shell or film of the same material as the crystalline semiconductor substrate surface used in step (a).

5. Quantum dot array or quantum dot superlattice structure obtained by the process of claim 4.

6. Quantum dot array or quantum dot superlattice structure obtained by the process of claim 3.

7. Process according to claim 2, wherein in step (c), the quantum dots are passivated by the addition of an inorganic shell or film of the same material as the crystalline semiconductor substrate surface used in step (a).

8. Quantum dot array or quantum dot superlattice structure obtained by the process of claim 7.

9. Quantum dot array or quantum dot superlattice structure obtained by the process of claim 2.

10. Process according to claim 1, wherein the quantum dots deposited contain one or more materials selected from the group consisting of: lead sulfide (PbS), cadmium selenide (CdSe).

11. Process according to claim 10, wherein in step (c), the quantum dots are passivated by the addition of an inorganic shell or film of the same material as the crystalline semiconductor substrate surface used in step (a).

12. Quantum dot array or quantum dot superlattice structure obtained by the process of claim 11.

13. Quantum dot array or quantum dot superlattice structure obtained by the process of claim 10.

14. Process according to claim 1, wherein in step (c), the quantum dots are passivated by the addition of an inorganic shell or film of the same material as the crystalline semiconductor substrate surface used in step (a).

15. Quantum dot array or quantum dot superlattice structure obtained by the process of claim 14.

16. Quantum dot array or quantum dot superlattice structure obtained by the process of claim 1.

17. Process according to claim 1, wherein the patterned surface is created by a photo/chemical etching technique or a lithographic technique.

18. Process according to claim 1, wherein the inorganic passivation layer comprises a barrier material, and a material for the quantum dots and the barrier material, expressed as (quantum dot material)/(barrier material), are a member selected from the group consisting of CdSe/ZnS, PbS/ZnS, PbS/CdS, CdTe/CdSe, CdSe/CdTe, ZnTe/CdS, $SnO_2$ or PbS /$TiO_2$ or ZnO, and CdS/$TiO_2$.

19. Quantum dot array or quantum dot superlattice structure obtained by the process of claim 18.

* * * * *